US011584868B2

(12) United States Patent
Kondo et al.

(10) Patent No.: US 11,584,868 B2
(45) Date of Patent: Feb. 21, 2023

(54) POLISHING LIQUID AND POLISHING METHOD

(71) Applicant: Showa Denko Materials Co., Ltd., Tokyo (JP)

(72) Inventors: Shunsuke Kondo, Tokyo (JP); Yuya Otsuka, Tokyo (JP); Mayumi Komine, Tokyo (JP); Keisuke Inoue, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 17/251,531

(22) PCT Filed: Jun. 13, 2019

(86) PCT No.: PCT/JP2019/023564
§ 371 (c)(1),
(2) Date: Dec. 11, 2020

(87) PCT Pub. No.: WO2019/240235
PCT Pub. Date: Dec. 19, 2019

(65) Prior Publication Data
US 2021/0253906 A1 Aug. 19, 2021

(30) Foreign Application Priority Data

Jun. 14, 2018 (WO) .................. PCT/JP2018/022785

(51) Int. Cl.
*C09G 1/02* (2006.01)
*C09K 13/00* (2006.01)
(Continued)

(52) U.S. Cl.
CPC ................ *C09G 1/02* (2013.01); *C09K 13/00* (2013.01); *H01L 21/3212* (2013.01); *H01L 21/7684* (2013.01)

(58) Field of Classification Search
CPC ............ C09G 1/02; C09K 13/00; C09K 3/14; C09K 3/1409; H01L 21/3212; H01L 21/7684; H01L 21/304; B24B 37/00
See application file for complete search history.

(56) References Cited

U.S. PATENT DOCUMENTS

| 4,944,836 A | 7/1990 | Beyer et al. |
| 2016/0108284 A1* | 4/2016 | Yoshizaki ................ C09G 1/00 252/79.1 |

(Continued)

FOREIGN PATENT DOCUMENTS

| CA | 2695921 A1 * | 3/2009 | ............... A01G 7/06 |
| JP | 2006-041514 A | 2/2006 | |

(Continued)

OTHER PUBLICATIONS

Pullulan, Wikipedia (Year: 2009).*
(Continued)

*Primary Examiner* — Duy Vu N Deo
(74) *Attorney, Agent, or Firm* — Fitch, Even, Tabin & Flannery, LLP

(57) ABSTRACT

A polishing liquid for polishing a surface to be polished containing cobalt, the polishing liquid containing abrasive grains, at least one sugar component selected from the group consisting of a sugar alcohol, a sugar alcohol derivative, and a polysaccharide, an acid component, and water, in which a pH of the polishing liquid is more than 8.0.

21 Claims, 1 Drawing Sheet

(51) Int. Cl.
*H01L 21/321* (2006.01)
*H01L 21/768* (2006.01)

(56) References Cited

U.S. PATENT DOCUMENTS

| | | | |
|---|---|---|---|
| 2017/0009101 A1* | 1/2017 | Yasui | H01L 21/3212 |
| 2020/0087538 A1* | 3/2020 | Lin | C09G 1/02 |

FOREIGN PATENT DOCUMENTS

| | | | |
|---|---|---|---|
| JP | 2011-003665 A | 1/2011 |
| JP | 2016-020294 A | 2/2016 |
| JP | 2016-178294 A | 10/2016 |
| TW | 201506100 A | 2/2015 |
| TW | 201540817 A | 11/2015 |
| WO | 2015/129342 A | 9/2015 |

OTHER PUBLICATIONS

Maltotriose, Wikipedia (Year: 2009).*
Wiki document of Glucomannan (Year: 2010).*
Wikipedia entry for Amylopectin, last edited Oct. 11, 2021; 2 pages.
Wikipedia entry for Amylose, last edited Mar. 13, 2022; 5 pages.
Wikipedia entry for Cellulose, last edited Feb. 24, 2022; 12 pages.
Wikipedia entry for Cyclodextrin, last edited Jan. 6, 2022; 6 pages.
Wikipedia entry for Dextran, last edited Mar. 9, 2022; 5 pages.
Wikipedia entry for Dextrin, last edited Mar. 30, 2022; 3 pages.
Wikipedia entry for Maltodextrin, last edited Apr. 14, 2022; 3 pages.
Wikipedia entry for Maltotriose, last edited Jan. 31, 2021; 3 pages.
Wikipedia entry for Oligosaccharide, last edited Mar. 30, 2022; 6 pages.
Wikipedia entry for Polysaccharide, last edited Apr. 20, 2022; 10 pages.
Vicki Caligur, "Dextran and Related Polysaccharides," BioFiles, 2008, 3.10, 17; 8 pages.

* cited by examiner

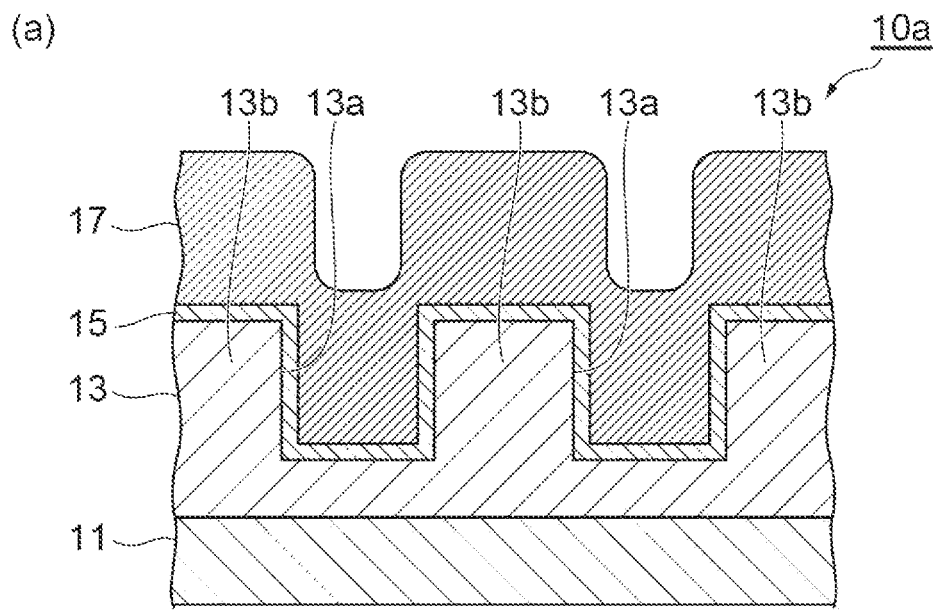
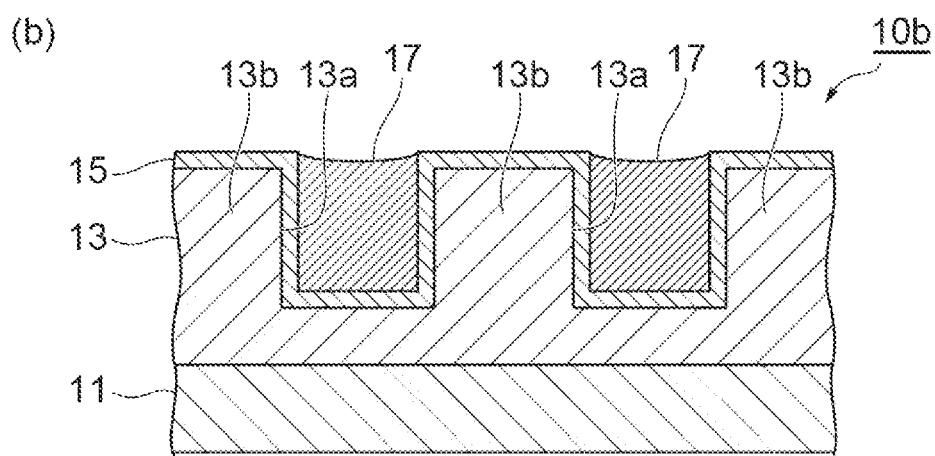
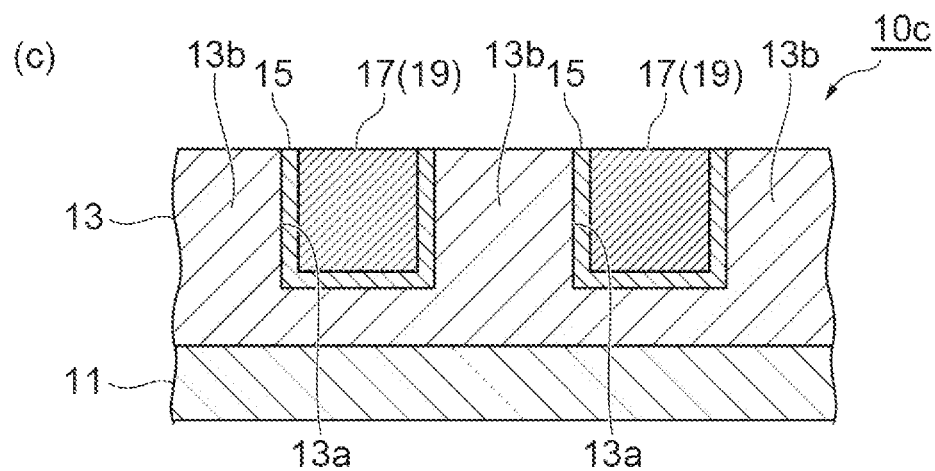

POLISHING LIQUID AND POLISHING METHOD

CROSS-REFERENCE TO RELATED APPLICATIONS

This application is a U.S. national phase application filed under 35 U.S.C. § 371 of International Application No. PCT/JP2019/023564, filed Jun. 13, 2019, designating the United States, which claims priority from International Application No. PCT/JP2018/022785, filed Jun. 14, 2018, which are hereby incorporated herein by reference in their entirety.

TECHNICAL FIELD

The present invention relates to a polishing liquid and a polishing method.

BACKGROUND ART

In recent years, new microfabrication technologies have been developed along with the tendencies of higher integration and higher performance of semiconductor integrated circuits (Large-Scale Integration; hereinafter, referred to as "LSI"). A chemical mechanical polishing (hereinafter, referred to as "CMP") method is one of such techniques. The CMP method is a technique that is frequently used in LSI manufacturing processes (particularly, in flattening of insulating films, formation of metal plugs, formation of buried wirings, and the like in multilayer wiring formation processes) (for example, see Patent Literature 1 below).

Currently, metals containing cobalt are used as a plug material, a wiring material, a contact material, a via material, a gate material, and the like. When an embedded portion such as a wiring or a plug is formed, for example, a damascene method is employed. In the damascene method, a base substrate, which includes an insulating member (a member containing an insulating material; for example, an interlayer insulating film) having unevenness on a surface, a liner portion disposed on the insulating member to follow the unevenness of the insulating member, and a conductive member disposed on the liner portion, is polished by using a polishing liquid and thereby an embedded portion composed of the conductive member embedded in a concave portion of the insulating member is formed. The formation step of an embedded portion includes a first step of polishing a conductive member until a liner portion is exposed, a second step of polishing the conductive member and the liner portion until a convex portion of an insulating member is exposed, and a third step of polishing the conductive member, the liner portion, and the insulating member to flatten a surface to be polished.

CITATION LIST

Patent Literature

Patent Literature 1: U.S. Pat. No. 4,944,836

SUMMARY OF INVENTION

Technical Problem

In recent years, from the viewpoint of having superior embeddability and the like, cobalt is used as a constituent material of the embedded portion in some cases. Furthermore, since the occupied area of the embedded portion (for example, a plug having a columnar shape) of the surface to be polished which is polished in the aforementioned third step tends to be narrower than that of the insulating member, there is a tendency that the embedded portion is hardly polished as compared to the insulating member. Therefore, for a polishing liquid to be used for forming an embedded portion containing cobalt, a high polishing rate ratio of cobalt with respect to the insulating material (the polishing rate of cobalt/the polishing rate of the insulating material) is required.

An object of an aspect of the present invention is to provide a polishing liquid and a polishing method by which a high polishing rate ratio of cobalt with respect to an insulating material can be obtained.

Solution to Problem

An aspect of the present invention provides a polishing liquid for polishing a surface to be polished containing cobalt, the polishing liquid containing abrasive grains, at least one sugar component selected from the group consisting of a sugar alcohol, a sugar alcohol derivative, and a polysaccharide, an acid component, and water, in which a pH of the polishing liquid is more than 8.0.

Another aspect of the present invention provides a polishing method of polishing a surface to be polished containing cobalt by using the aforementioned polishing liquid.

According to these polishing liquid and polishing method, a high polishing rate ratio of cobalt with respect to an insulating material can be obtained.

Advantageous Effects of Invention

According to an aspect of the present invention, a high polishing rate ratio of cobalt with respect to an insulating material can be obtained.

BRIEF DESCRIPTION OF DRAWINGS

FIG. 1 is a schematic cross-sectional view illustrating an example of a polishing method.

DESCRIPTION OF EMBODIMENTS

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical range may be replaced with the value shown in the examples. "A or B" may include either one of A and B, and may also include both of A and B. Materials listed as examples in the present specification can be used singly or in combinations of two or more, unless otherwise specified. When a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

Hereinafter, embodiments of the present invention will be described. However, the present invention is not limited to the following embodiments at all.

<Polishing Liquid>

A polishing liquid of the present embodiment is a polishing liquid for polishing a surface to be polished containing cobalt. The polishing liquid of the present embodiment contains abrasive grains; at least one sugar component selected from the group consisting of a sugar alcohol, a sugar alcohol derivative, and a polysaccharide; an acid component; and water. The pH of the polishing liquid of the present embodiment is more than 8.0. The polishing liquid of the present embodiment can be used as a CMP polishing liquid. According to the polishing liquid of the present embodiment, a high polishing rate ratio of cobalt with respect to an insulating material can be obtained. According to the polishing liquid of the present embodiment, a high polishing rate ratio of cobalt with respect to an insulating material can be obtained while a satisfactory polishing rate of cobalt is obtained.

(Abrasive Grains)

Examples of constituent materials of the abrasive grains include inorganic substances such as silica, alumina, ceria, titania, zirconia, germania, and silicon carbide; organic substances such as polystyrene, polyacrylic acid, and polyvinyl chloride; and modified substances thereof. Examples of abrasive grains containing the above-described modified substances include abrasive grains in which surfaces of particles containing silica, alumina, ceria, titania, zirconia, germania, or the like are modified with an alkyl group. The abrasive grains can be used singly or in combination of two or more types thereof. The abrasive grains may not contain zirconia.

The abrasive grains may contain silica from the viewpoint of hardly generating defects such as scratches on a surface (a surface of a wiring portion, a surface of a liner portion, a surface of an insulating portion, or the like) of a polishing target after polishing. Examples of the abrasive grains containing silica include amorphous silica, crystalline silica, molten silica, spherical silica, synthetic silica, hollow silica, and colloidal silica. The abrasive grains preferably contain colloidal silica from the viewpoint of easily reducing polishing scratches.

The lower limit of the content of silica in the abrasive grains containing silica may be 80% by mass or more, 90% by mass or more, 95% by mass or more, 98% by mass or more, and 99% by mass or more on the basis of the whole abrasive grains (the whole abrasive grains contained in the polishing liquid), from the viewpoint of easily obtaining a polishing rate necessary for polishing. The abrasive grains may have an embodiment substantially composed of silica (100% by mass of the abrasive grains are substantially particles of silica).

The average secondary particle diameter of the abrasive grains may be 120 nm or less, 100 nm or less, 90 nm or less, and 80 nm or less, from the viewpoint of hardly generating defects such as scratches on the polished surface. The average secondary particle diameter of the abrasive grains may be 5 nm or more, 10 nm or more, and 15 nm or more, from the viewpoints of having sufficient removing ability of the metal containing cobalt and easily obtaining a required polishing rate of cobalt. From these viewpoints, the average secondary particle diameter of the abrasive grains may be 5 to 120 nm. The average secondary particle diameter of the abrasive grains is measured using a light diffraction scattering particle size distribution meter (for example, manufactured by Beckman Coulter, Inc., trade name: N5).

The content of the abrasive grains may be in the following range on the basis of the total mass of the polishing liquid. The content of the abrasive grains may be 0.01% by mass or more, 0.05% by mass or more, 0.1% by mass or more, 0.25% by mass or more, 0.5% by mass or more, 0.6% by mass or more, 0.8% by mass or more, 1% by mass or more, 1.5% by mass or more, 2% by mass or more, 2.5% by mass or more, and 3% by mass or more, from the viewpoints of having sufficient removing ability of the metal containing cobalt and easily obtaining a required polishing rate of cobalt. The content of the abrasive grains may be 20% by mass or less, 15% by mass or less, 10% by mass or less, and 5% by mass or less, from the viewpoints of easily obtaining satisfactory dispersion stability of the abrasive grains and hardly generating defects such as scratches. From these viewpoints, the content of the abrasive grains may be 0.01 to 20% by mass.

(Additive)

The polishing liquid of the present embodiment can contain additives in addition to the abrasive grains and water.

[Sugar Component: Sugar Alcohol, Sugar Alcohol Derivative, and Polysaccharide]

The polishing liquid of the present embodiment contains at least one sugar component selected from the group consisting of a sugar alcohol, a sugar alcohol derivative, and a polysaccharide from the viewpoint of obtaining a high polishing rate ratio of cobalt with respect to an insulating material. The sugar component may include at least one sugar alcohol component selected from the group consisting of a sugar alcohol and a sugar alcohol derivative and may include a sugar alcohol, from the viewpoint of easily improving a polishing rate ratio of cobalt with respect to an insulating material while a satisfactory polishing rate of cobalt is obtained. The sugar component can be used singly or in combination of two or more types thereof.

Examples of the sugar alcohol include sorbitol, erythritol, pentaerythritol, arabitol, ribitol, xylitol, dulcitol, maltitol, and mannitol. Examples of the derivative of the sugar alcohol include sugar alcohol esters (for example, sorbitol fatty acid ester). The sugar alcohol may include sorbitol from the viewpoint of easily improving a polishing rate ratio of cobalt with respect to an insulating material.

The number of carbon atoms in the sugar alcohol component (the sugar alcohol or the sugar alcohol derivative) may be 4 or more, 5 or more, and 6 or more. The number of carbon atoms in the sugar alcohol component may be 8 or less, 7 or less, and 6 or less.

The number of hydroxyl groups in the sugar alcohol component may be 4 or more, 5 or more, and 6 or more. The number of hydroxyl groups in the sugar alcohol component may be 8 or less, 7 or less, and 6 or less.

Examples of the polysaccharide include a cellulose compound; dextrin; maltodextrin; cyclodextrin; dextran; oligosaccharide; pullulan; amylose; and amylopectin.

The cellulose compound is a compound having a cellulose skeleton. As the cellulose compound, at least one selected from the group consisting of cellulose and a cellulose derivative can be used. The cellulose derivative is, for example, a compound in which at least a part of the hydroxyl groups of cellulose is etherified. Examples of the cellulose derivative include alkyl cellulose, hydroxyalkyl cellulose, and carboxyalkyl cellulose.

The alkyl cellulose is a compound in which at least a part of the hydroxyl group of cellulose is etherified with a hydrocarbon group (an ethyl group, a methyl group, a propyl group, or the like). Examples of the alkyl cellulose include methyl cellulose and ethyl cellulose.

The hydroxyalkyl cellulose is a compound obtained by reaction between the hydroxyl group of cellulose and alkylene oxide (ethylene oxide, propylene oxide, or the like). Examples of the hydroxyalkyl cellulose include hydroxymethyl cellulose, hydroxyethyl cellulose, hydroxypropyl cellulose, hydroxypropylmethyl cellulose, and hydroxyethylmethyl cellulose. The number of carbon atoms of the hydroxyalkyl group in the hydroxyalkyl cellulose may be 1 or more, 2 or more, and 3 or more, from the viewpoint of easily improving a polishing rate ratio of cobalt with respect to an insulating material. The number of carbon atoms of the hydroxyalkyl group in the hydroxyalkyl cellulose may be 5 or less, 4 or less, and 3 or less, from the viewpoint of easily improving a polishing rate ratio of cobalt with respect to an insulating material.

The carboxyalkyl cellulose is a compound in which the hydroxyl group of cellulose is etherified with a carboxyalkyl group (a carboxymethyl group, a carboxyethyl group, a carboxypropyl group, or the like). Examples of the carboxyalkyl cellulose include carboxymethyl cellulose and carboxyethyl cellulose.

Examples of the dextrin include dextrin having an aldehyde group at the terminal of a decomposition substance, which is obtained by the decomposition of starch; indigestible dextrin collected by purifying a substance, that is a part of starch, which has not been easily decomposed in a process of decomposition of starch; reduction type dextrin obtained by reducing the above-described aldehyde terminal with hydrogenation to convert the aldehyde terminal to a hydroxyl group (for example, a powdered reduced starch decomposition substance); highly branched cyclic dextrin; and dextrin hydrate. Examples of the cyclodextrin include α-cyclodextrin, β-cyclodextrin, and γ-cyclodextrin. Examples of the oligosaccharide include sucrose, maltose, isomaltose, maltotriose, and stachyose.

The polysaccharide may include at least one selected from the group consisting of a cellulose compound, dextrin, dextran, and pullulan and may include at least one selected from the group consisting of hydroxyalkyl cellulose, dextrin, dextran, and pullulan, from the viewpoint of easily improving a polishing rate ratio of cobalt with respect to an insulating material.

The content of the sugar component may be in the following range on the basis of the total mass of the polishing liquid. The content of the sugar component may be 0.01% by mass or more, 0.03% by mass or more, 0.05% by mass or more, 0.07% by mass or more, 0.09% by mass or more, and 0.1% by mass or more, from the viewpoint of easily improving a polishing rate ratio of cobalt with respect to an insulating material. The content of the sugar component may be 20% by mass or less, 10% by mass or less, 8% by mass or less, 5% by mass or less, 4% by mass or less, 3% by mass or less, 2% by mass or less, 1% by mass or less, 0.5% by mass or less, and 0.3% by mass or less, from the viewpoint of easily improving a polishing rate ratio of cobalt with respect to an insulating material. From these viewpoints, the content of the sugar component may be 0.01 to 20% by mass. Furthermore, the content of the sugar component may be more than 0.2% by mass and may be 0.3% by mass or more. The content of the sugar component may be more than 0.2% by mass and 20% by mass or less, and may be 0.3 to 20% by mass.

The content of the sugar component may be in the following range with respect to 100 parts by mass of the abrasive grains. The content of the sugar component may be 0.1 parts by mass or more, 0.5 parts by mass or more, 1 part by mass or more, 2 parts by mass or more, and 3 parts by mass or more, from the viewpoint of easily improving a polishing rate ratio of cobalt with respect to an insulating material. The content of the sugar component may be less than 50 parts by mass, 40 parts by mass or less, 30 parts by mass or less, 20 parts by mass or less, and 10 parts by mass or less, from the viewpoint of easily improving a polishing rate ratio of cobalt with respect to an insulating material. From these viewpoints, the content of the sugar component may be 0.1 parts by mass or more and less than 50 parts by mass. Furthermore, the content of the sugar component may be 5 parts by mass or less and 4 parts by mass or less. In a case where the polishing liquid of the present embodiment contains at least one selected from the group consisting of a sugar alcohol and a sugar alcohol derivative (for example, in a case where the polishing liquid contains a sugar alcohol), the content of the sugar component may be in the above-described range with respect to 100 parts by mass of the abrasive grains.

[Acid Component]

The acid component can function as a metal dissolving agent dissolving a metal (oxidized metal or the like). The acid component is, for example, a metal oxide dissolving agent. Examples of the acid component include an organic acid, an organic acid ester, an organic acid salt, an inorganic acid, and an inorganic acid salt. The acid component may include an organic acid from the viewpoint of easily improving a polishing rate ratio of cobalt with respect to an insulating material. The acid component may have water solubility. The acid component also corresponding to the aforementioned sugar component is determined to belong to the sugar component.

Examples of the organic acid include amino acid and an organic acid different from the amino acid. Examples of the amino acid include glycine, alanine, leucine, isoleucine, asparagine, aspartic acid, arginine, threonine, and cysteine. Examples of the organic acid different from the amino acid include monocarboxylic acids such as acetic acid, propionic acid, and benzoic acid; and dicarboxylic acids such as malonic acid, succinic acid, citric acid, malic acid, diglycolic acid, isophthalic acid, methylsuccinic acid, oxalic acid, tartaric acid, picolinic acid, phthalic acid, adipic acid, and glutaric acid. Examples of the organic acid salt include an ammonium salt. Examples of the inorganic acid include sulfuric acid, nitric acid, phosphoric acid, and hydrochloric acid. The acid component can be used singly or in combination of two or more types thereof.

The acid component may include an organic acid and may include at least one selected from the group consisting of amino acid and dicarboxylic acid (excluding a compound corresponding to the amino acid), from the viewpoint of easily improving a polishing rate of cobalt. The dicarboxylic acid may include at least one selected from the group consisting of malonic acid, succinic acid, citric acid, malic acid, diglycolic acid, isophthalic acid, and methylsuccinic acid, from the viewpoint of easily improving a polishing rate of cobalt. The amino acid may include at least one selected from the group consisting of glycine, isoleucine, asparagine, aspartic acid, arginine, and threonine, from the viewpoint of easily improving a polishing rate of cobalt.

The content of the acid component may be in the following range on the basis of the total mass of the polishing liquid. The content of the acid component may be 0.005% by mass or more, 0.01% by mass or more, 0.05% by mass or more, 0.1% by mass or more, and 0.3% by mass or more, from the viewpoint of easily improving a polishing rate of cobalt. The content of the acid component may be 5% by mass or less, 3% by mass or less, 2.5% by mass or less, 2.25% by mass or less, 2% by mass or less, 1.75% by mass or less, 1.5% by mass or less, 1.25% by mass or less, 1% by mass or less, 0.8% by mass or less, 0.5% by mass or less, and 0.4% by mass or less, from the viewpoint that the storage stability of the polishing liquid is improved since the abrasive grains hardly aggregate and thus a stable polishing rate is easily obtainable. From these viewpoints, the content of the acid component may be 0.005 to 5% by mass.

[Metal Corrosion Inhibitor]

The polishing liquid of the present embodiment may contain a metal corrosion inhibitor. The metal corrosion inhibitor is a compound capable of forming a protective film for preventing excessive corrosion of the polished portion containing a metal on the surface of the polished portion, by generating a chelate complex with a metal such as cobalt. Examples of the metal corrosion inhibitor include a compound having a triazole skeleton, a compound having an imidazole skeleton, a compound having a pyrimidine skeleton, a compound having a guanidine skeleton, a compound having a thiazole skeleton, and a compound having a pyrazole skeleton.

Examples of the compound having a triazole skeleton include 1,2,3-triazole, benzotriazole, 1-hydroxybenzotriazole, bis[(1-benzotriazolyl)methyl]phosphonic acid, and 5-methylbenzotriazole. Examples of the compound having an imidazole skeleton include 2-methylimidazole and 2-aminoimidazole.

Examples of the compound having a pyrimidine skeleton include pyrimidine and 1,2,4-triazolo[1,5-a]pyrimidine. Examples of the compound having a guanidine skeleton include 1,3-diphenylguanidine and 1-methyl-3-nitroguanidine. Examples of the compound having a thiazole skeleton include 2-mercaptobenzothiazole and 2-aminothiazole.

Examples of the compound having a pyrazole skeleton include 3,5-dimethylpyrazole, 3-methyl-5-pyrazolone, and 3-amino-5-methylpyrazole. The metal corrosion inhibitor may include a compound having a triazole skeleton from the viewpoint of easily suppressing the corrosion of the polished portion. The compound having a triazole skeleton may include at least one selected from the group consisting of 1,2,3-triazole, 1,2,4-triazole, 3-amino-1H-1,2,4-triazole, 4-amino-4H-1,2,4-triazole, benzotriazole, 1-hydroxybenzotriazole, and 5-methylbenzotriazole, from the viewpoint of easily suppressing the corrosion of the polished portion. The metal corrosion inhibitor can be used singly or in combination of two or more types thereof.

The content of the metal corrosion inhibitor may be in the following range on the basis of the total mass of the polishing liquid. The content of the metal corrosion inhibitor may be 0.0005% by mass or more, 0.001% by mass or more, and 0.003% by mass or more, from the viewpoint of easily suppressing the corrosion of the polished portion. The content of the metal corrosion inhibitor may be 0.5% by mass or less, 0.3% by mass or less, and 0.1% by mass or less, from the viewpoint that the storage stability of the polishing liquid is improved since the abrasive grains hardly aggregate and thus a stable polishing rate is easily obtainable. From these viewpoints, the content of the metal corrosion inhibitor may be 0.0005 to 0.5% by mass.

[Oxidant]

The polishing liquid of the present embodiment can contain an oxidant, but may not contain an oxidant. Examples of the oxidant include hydrogen peroxide, potassium periodate, ammonium persulfate, hypochlorous acid, and ozone water. The oxidant may be hydrogen peroxide from the viewpoint of being relatively stable even after addition. The oxidant can be used singly or in combination of two or more types thereof.

In a case where the polishing liquid contains an oxidant, the content of the oxidant may be in the following range on the basis of the total mass of the polishing liquid. The content of the oxidant may be 0.01% by mass or more, 0.02% by mass or more, and 0.03% by mass or more, from the viewpoints of oxidizing a surface to be polished containing a metal and easily securing a sufficient polishing rate. The content of the oxidant may be 10% by mass or less, 5% by mass or less, and 3% by mass or less, from the viewpoint of easily suppressing roughening of a surface to be polished. From these viewpoints, the content of the oxidant may be 0.01 to 10% by mass.

[pH Adjusting Agent]

The polishing liquid of the present embodiment may contain a pH adjusting agent for the purpose of adjusting the pH of the polishing liquid to a desired pH, or the like. Examples of the pH adjusting agent include hydroxides of alkali metals, hydroxides of alkaline-earth metals, and ammonia. The pH adjusting agent may be at least one selected from the group consisting of potassium hydroxide, benzylamine, and diethanolamine from the viewpoint of easily preventing the aggregation of the abrasive grains. The pH adjusting agent can be used singly or in combination of two or more types thereof

[Other Additives]

The polishing liquid of the present embodiment may contain additives different from the aforementioned components. Examples of such additives include a water-soluble polymer and an organic solvent. The polishing liquid of the present embodiment may not contain a water-soluble polymer. The content of the water-soluble polymer may be less than 0.025% by mass and may be more than 0.3% by mass on the basis of the total mass of the polishing liquid. Even in these cases, a polishing rate ratio of 0.60 or more can be obtained as the polishing rate ratio of cobalt with respect to an insulating material.

(Water)

Water is not particularly limited, and examples thereof include ion-exchanged water (deionized water), pure water, ultrapure water, and distilled water. The content of water may be the remainder of the polishing liquid excluding the content of the other constituent components and is not particularly limited.

(pH of Polishing Liquid)

The pH of the polishing liquid of the present embodiment is more than 8.0 from the viewpoint of obtaining a high polishing rate ratio of cobalt with respect to an insulating material. The pH of the polishing liquid may be 8.2 or more, 8.5 or more, more than 8.5, 8.7 or more, 9.0 or more, more than 9.0, 9.5 or more, and more than 9.5, from the viewpoint of easily obtaining a high polishing rate ratio of cobalt with respect to an insulating material. The pH of the polishing liquid may be 12.0 or less, less than 12.0, 11.0 or less, less than 11.0, 10.5 or less, less than 10.5, and 10.0 or less, from the viewpoint of suppressing the dissolution of a portion to be polished in a case where a polishing target includes a portion to be polished containing silicon to easily obtain a stable polishing rate and the viewpoint of suppressing the dissolution of the abrasive grains in a case where the abrasive grains contain silica to easily obtain a stable polishing rate. From these viewpoints, the pH of the polishing liquid may be more than 8.0 and 12.0 or less. The pH of the polishing liquid may be less than 9.0. The pH of the polishing liquid is defined as the pH at a liquid temperature of 25° C.

The pH of the polishing liquid can be measured by a pH meter (for example, Model F-51 manufactured by HORIBA, Ltd.). Specifically, after 3-point calibration using standard buffer solution (phthalate pH buffer solution, pH: 4.01 (25° C.); neutral phosphate pH buffer solution, pH 6.86 (25° C.); borate pH buffer solution, pH: 9.18 (25° C.)), an electrode is placed in the polishing liquid and the measurement value upon stabilization after an elapse of 3 minutes or longer can be obtained as the pH of the polishing liquid. The liquid temperature of both the standard buffer solution and the polishing liquid are set to 25° C.

The polishing liquid of the present embodiment may be stored as a one-pack polishing liquid containing at least abrasive grains, a sugar component, an acid component, and water, and may be stored as a multi-pack polishing liquid having a slurry (first liquid) and an additive liquid (second liquid). In the multi-pack polishing liquid, the constituent components of the above-described polishing liquid are divided into the slurry and the additive liquid so that the slurry and the additive liquid are mixed to form the above-described polishing liquid. The slurry contains, for example, at least abrasive grains and water. The additive liquid contains, for example, at least a sugar component, an acid component, and water. The other additives may be contained in the additive liquid among the slurry and the additive liquid. The constituent components of the polishing liquid may be stored separately in three or more liquids. In the multi-pack polishing liquid, the polishing liquid may be prepared by mixing the slurry and the additive liquid immediately before polishing or during polishing. It is also acceptable to supply each of the slurry and the additive liquid in the multi-pack polishing liquid onto a polishing platen, and to polish a surface to be polished by the use of the polishing liquid obtained by mixing the slurry and the additive liquid on the polishing platen.

A stock solution for the polishing liquid of the present embodiment is a stock solution for obtaining the above-described polishing liquid, and the stock solution for the polishing liquid is diluted with water to obtain the above-described polishing liquid. The stock solution for the polishing liquid is stored in such a state that the amount of water is more reduced than that during use, and can be used as the above-described polishing liquid by being diluted with water before use or during use. The stock solution for the polishing liquid is different from the above-described polishing liquid in such a point that the content of water is smaller than that in the above-described polishing liquid. The dilution ratio is, for example, 1.5 times or more.

<Polishing Method>

A polishing method of the present embodiment includes a polishing step of polishing a surface to be polished containing cobalt by using the polishing liquid of the present embodiment. In the polishing step, the surface to be polished containing cobalt is polished and thereby at least a part of cobalt can be removed. In the polishing step, regarding a base substrate having a surface to be polished containing cobalt, the surface to be polished can be polished. The base substrate may include a member containing cobalt as a member having a surface to be polished containing cobalt. Constituent materials of the surface to be polished containing cobalt may be materials containing a cobalt atom, and examples thereof include a cobalt simple substance, a cobalt alloy, an oxide of cobalt, and an oxide of a cobalt alloy.

The polishing step may be a step of polishing a surface to be polished containing cobalt and an insulating material, and may be, for example, a step of polishing a surface to be polished having a part containing cobalt and a part containing an insulating material. A base substrate may include a member containing cobalt and a member containing an insulating material. Examples of the insulating material include a silicon-based insulating material and an organic polymer-based insulating material. Examples of the silicon-based insulating material include silicon oxide (for example, silicon dioxide obtained by using tetraethyl orthosilicate (TEOS)), silicon nitride, tetraethoxysilane, fluorosilicate glass, organosilicate glass obtained by using trimethylsilane or dimethoxydimethylsilane as a starting material, silicon oxynitride, hydrogenated silsesquioxane, silicon carbide, and silicon nitride. Examples of the organic polymer-based insulating material include wholly aromatic low-dielectric constant insulating materials.

The polishing step may be a step of polishing a surface to be polished containing cobalt, an insulating material, and a conductive material (excluding cobalt; hereinafter, the same applies) and may be, for example, a step of polishing a surface to be polished having a part containing cobalt, a part containing an insulating material, and a part containing a conductive material. A base substrate may include a member containing cobalt, a member containing an insulating material, and a member containing a conductive material. Examples of the conductive material include materials containing copper, tungsten, tantalum, titanium, ruthenium, a noble metal (silver, gold, or the like), or the like. Examples of the conductive material include copper, a copper alloy, an oxide of copper, an oxide of a copper alloy; a tungsten simple substance, tungsten nitride, a tungsten alloy; a tantalum simple substance, tantalum nitride, a tantalum alloy; a titanium simple substance, titanium nitride, a titanium alloy; a ruthenium simple substance, ruthenium nitride, a ruthenium alloy; and a noble metal (silver, gold, or the like).

In the polishing method of the present embodiment, cobalt can be selectively polished with respect to an insulating material. The polishing rate ratio of cobalt with respect to the insulating material may be 0.60 or more, 0.65 or more, 0.70 or more, 0.75 or more, 0.80 or more, 0.85 or more, 0.90 or more, 0.95 or more, and 1.00 or more.

In the polishing step, for example, while a surface to be polished of a base substrate having the surface to be polished is pressed against a polishing pad (polishing cloth) of a polishing platen, the polishing liquid is supplied between the surface to be polished and the polishing pad, and the base substrate and the polishing platen are relatively moved to polish the surface to be polished.

As an apparatus used in polishing, a general polishing apparatus having a holder holding a base substrate and a polishing platen which is connected to a motor or the like capable of changing the rotation speed and to which a polishing pad can be attached can be used. The polishing pad is not particularly limited, and a general nonwoven fabric, foamed polyurethane, a porous fluororesin, or the like can be used.

Polishing conditions are not particularly limited. The rotational speed of the polishing platen may be 200 $min^{-1}$ (=rpm) or less to prevent the base substrate from flying off from the polishing platen. The pressing pressure of the base substrate against the polishing pad may be 1 to 100 kPa.

As the base substrate, a base substrate, which includes an insulating member (a member containing an insulating material) having unevenness on a surface, a liner portion disposed on the insulating member to follow the unevenness of the insulating member, and a conductive member (a member containing a conductive material) disposed on the liner portion, can be used. As the base substrate, for example, a semiconductor substrate can be used. The liner portion is disposed for prevention of diffusion of the conductive material into the insulating member, or the like.

The polishing step may be a step of polishing a base substrate to form an embedded portion composed of a conductive member embedded in a concave portion (for example, a columnar concave portion) of an insulating member. In this case, the polishing step includes a first step of polishing a conductive member until a liner portion is exposed, a second step of polishing the conductive member and the liner portion until a convex portion of an insulating member is exposed, and a third step of polishing the conductive member, the liner portion, and the insulating member to flatten a surface to be polished, in this order. The polishing liquid of the present embodiment can be used in all of the first to third steps.

In the present embodiment, the conductive member may contain cobalt. In this case, for example, as the conductive member (the member containing cobalt) embedded in the concave portion of the insulating member, a plug (for example, a cylindrical plug), a wiring, a contact, a via, a gate, or the like can be formed. As a constituent material of the liner portion, tantalum, titanium, or the like can be used. The polishing liquid providing a high polishing rate (for example, 100 nm/min or more) of cobalt can be suitably used in polishing of the conductive member containing cobalt in the aforementioned first step and second step.

In the present embodiment, the liner portion may contain cobalt. In this case, examples of constituent materials of the conductive member include the aforementioned conductive materials.

FIG. 1 is a schematic cross-sectional view illustrating an example of a polishing method of the present embodiment. In the polishing method illustrated in FIG. 1, first, a base substrate 10a illustrated in FIG. 1(a) is prepared. The base substrate 10a includes a substrate 11, an insulating member (interlayer insulating film) 13 disposed on the substrate 11 and having unevenness on a surface, a liner portion 15 disposed on the insulating member 13 to follow the unevenness of the insulating member 13, and a conductive member 17 disposed on the liner portion 15. The insulating member 13 has a concave portion (for example, a columnar concave portion) 13a and a convex portion 13b. The conductive member 17 contains cobalt. The liner portion 15 is disposed along the inner wall of the concave portion 13a and the upper surface of the convex portion 13b, and the conductive member 17 is filled on the liner portion 15 in the concave portion 13a.

Next, as the first step, the conductive member 17 of the base substrate 10a is polished until the liner portion 15 is exposed and thereby a base substrate 10b illustrated in FIG. 1(b) is obtained. Subsequently, as the second step, the liner portion 15 and the conductive member 17 of the base substrate 10b are polished until the convex portion 13b of the insulating member 13 is exposed, the insulating member 13, the liner portion 15, and the conductive member 17 are then polished to flatten a surface to be polished, and thereby a base substrate 10c illustrated in FIG. 1(c) is obtained. The base substrate 10c has an embedded portion 19 composed of the conductive member 17 embedded in the concave portion 13a of the insulating member 13.

EXAMPLES

Hereinafter, the present invention will be described in detail by means of Examples; however, the present invention is not limited to the following Examples.

<Preparation of Abrasive Grains>

As the abrasive grains, silica particles having an average secondary particle diameter of 60 nm (abrasive grains containing silica) were prepared. The average secondary particle diameter of the silica particles was measured by a photon correlation method using particle size distribution (trade name: N5) manufactured by Beckman Coulter, Inc. Specifically, as an aqueous dispersion of silica particles, a measuring sample having a scattering intensity of $5.0 \times 10^4$ to $1.0 \times 10^6$ cps was prepared, the measurement sample was then placed in a plastic cell, and the average secondary particle diameter was measured.

<Preparation of Polishing Liquid>

The respective components were mixed to prepare a polishing liquid containing components shown in Tables 1 to 4. The content of each component in Tables 1 to 4 is the content (unit: % by mass) based on the total mass of the polishing liquid. The content of the pH adjusting agent was adjusted to an amount with which the pH shown in the table was obtainable. As hydroxypropyl cellulose, an aqueous solution of hydroxypropyl cellulose (viscosity (20° C.): 1000 to 4000 mPa·s, manufactured by KANTO CHEMICAL CO., INC., trade name: Hydroxypropyl Cellulose (1000 to 4000 mPa·s, 2% in Water at 20° C.)) was used. The amount of hydroxypropyl cellulose shown in the table indicates the amount of hydroxypropyl cellulose not including the amount of water.

<Measurement of pH>

The pH of each polishing liquid was measured according to the following. Measurement results are shown in Tables 1 to 4.

Measurement temperature: 25° C.

Measuring instrument: pH meter (Model F-51 manufactured by HORIBA, Ltd.)

Measurement method: After 3-point calibration using standard buffer solution (phthalate pH buffer solution, pH: 4.01 (25° C.); neutral phosphate pH buffer solution, pH 6.86 (25° C.); borate pH buffer solution, pH: 9.18 (25° C.)), an electrode was placed in the polishing liquid and the value upon stabilization after an elapse of 3 minutes or longer was measured.

<Polishing of Base Substrate>

Films to be polished (a cobalt film and an insulating film) of the following base substrates for evaluation were polished by using each polishing liquid under the following polishing conditions, and the polishing rate of cobalt and the polishing rate of the insulating material were measured. Electrical resistance values of the films to be polished before and after polishing obtained by using a resistance measuring device VR-120/08S (manufactured by Hitachi Kokusai Electric Inc.) were converted to obtain a difference in thickness before and after polishing, the difference in thickness was divided by a polishing time, and thereby a polishing rate was obtained. Furthermore, the polishing rate ratio of cobalt with respect to the insulating material (the polishing rate of cobalt/the polishing rate of the insulating material) was obtained. Results are shown in Tables 1 to 4.

(Base Substrate for Evaluation)

First substrate for evaluation: Base substrate having a cobalt film having a thickness of 200 nm disposed on a silicon substrate (wafer with a diameter of 12 inch)

Second substrate for evaluation: Base substrate having an insulating film having a thickness of 1000 nm (silicon dioxide film obtained by using TEOS: TEOS film) disposed on a silicon substrate (wafer with a diameter of 12 inch)

(Polishing Conditions)

Polishing machine: Polishing machine for single side (manufactured by EBARA CORPORATION, trade name: F-REX300)

Polishing pad: H800 (manufactured by Fujibo Holdings, Inc.)

Polishing pressure: 10.3 kPa

Number of revolutions of platen: 93 rpm

Number of revolutions of head: 87 rpm

Amount of polishing liquid to be supplied: 250 ml/min

Polishing time: 30 seconds

TABLE 1

|  |  | Example |  |  |  |  |  |  |  |
|---|---|---|---|---|---|---|---|---|---|
|  |  | 1 | 2 | 3 | 4 | 5 | 6 | 7 | 8 |
| Abrasive grains | Silicla particles | 3.0 | 3.0 | 3.0 | 3.0 | 3.0 | 3.0 | 3.0 | 3.0 |
| Sugar component | Sorbitol | 0.1 | — | — | — | — | 0.3 | 0.6 | 0.9 |
|  | Hydroxypropyl cellulose | — | 0.1 | — | — | — | — | — | — |
|  | Dextrin | — | — | 0.1 | — | — | — | — | — |
|  | Dextran | — | — | — | 0.1 | — | — | — | — |
|  | Pullulan | — | — | — | — | 0.1 | — | — | — |
| Acid component | Citrid acid | 0.3 | 0.3 | 0.3 | 0.3 | 0.3 | 0.3 | 0.3 | 0.3 |
| Metal corrosion inhibitor | Benzotriazole | 0.1 | 0.1 | 0.1 | 0.1 | 0.1 | 0.1 | 0.1 | 0.1 |
| pH adjusting agent | Potassium hydroxide | Amount with which pH is adjusted to pH described below | | | | | | | |
| Water | Pure water | Remainder | | | | | | | |
|  | pH | 10.0 | 10.0 | 10.0 | 10.0 | 10.0 | 8.5 | 8.5 | 8.5 |
| Polishing rate (nm/min) | Cobalt | 21 | 21 | 20 | 21 | 21 | 23 | 22 | 24 |
|  | Insulating material | 29 | 31 | 30 | 30 | 32 | 27 | 28 | 27 |
| Polishing rate ratio (cobalt/insulating material) |  | 0.72 | 0.68 | 0.67 | 0.70 | 0.66 | 0.85 | 0.79 | 0.89 |

TABLE 2

|  |  | Example |  |  |  |  |  |  |  |  |  |  |  |
|---|---|---|---|---|---|---|---|---|---|---|---|---|---|
|  |  | 9 | 10 | 11 | 12 | 13 | 14 | 15 | 16 | 17 | 18 | 19 | 20 |
| Abrasive grains | Silica particles | 4.0 | 4.0 | 4.0 | 4.0 | 4.0 | 4.0 | 5.0 | 5.0 | 5.0 | 1.0 | 1.0 | 1.0 |
| Sugar component | Sorbitol | 0.5 | 1.0 | 3.0 | 1.0 | 3.0 | 5.0 | 0.3 | 0.6 | 0.9 | 0.3 | 0.6 | 1.0 |
| Acid component | Malonic acid | 0.4 | 0.4 | 0.4 | — | — | — | — | — | — | — | — | — |
|  | Glycine | — | — | — | 0.5 | 0.5 | 0.5 | 0.5 | 0.5 | 0.5 | 0.8 | 0.8 | 0.8 |
| Metal corrosion inhibitor | Benzotriazole | 0.1 | 0.1 | 0.1 | 0.1 | 0.1 | 0.1 | 0.1 | 0.1 | 0.1 | 0.1 | 0.1 | 0.1 |
| Oxidant | Hydrogen peroxide | — | — | — | — | — | — | — | — | — | 0.03 | 0.03 | 0.03 |
| ph adjusting agent | Potassium hydroxide | Amount with which pH is adjusted to pH described below | | | | | | | | | | | |
| Water | Pure water | Remainder | | | | | | | | | | | |
|  | pH | 9.0 | 9.0 | 9.0 | 10.5 | 10.5 | 10.5 | 10.0 | 10.0 | 10.0 | 9.0 | 9.0 | 9.0 |
| Polishing rate (nm/min) | Cobalt | 27 | 29 | 27 | 35 | 36 | 33 | 55 | 54 | 55 | 109 | 107 | 108 |
|  | Insulating material | 42 | 44 | 43 | 40 | 42 | 41 | 49 | 48 | 48 | 5 | 4 | 5 |
| Polishing rate ratio (cobalt/insulating material) |  | 0.64 | 0.66 | 0.63 | 0.88 | 0.85 | 0.81 | 1.12 | 1.13 | 1.15 | 21.80 | 26.75 | 21.60 |

TABLE 3

|  |  | Example | | | | | |
| --- | --- | --- | --- | --- | --- | --- | --- |
|  |  | 21 | 22 | 23 | 24 | 25 | 26 |
| Anrasive grains | Silica particles | 1.0 | 0.5 | 3.0 | 3.0 | 3.0 | 3.0 |
| Sugar component | Sorbitol | 0.1 | 0.1 | 0.1 | 0.1 | 0.1 | 0.1 |
| Acid component | Citric acid | 0.3 | 0.3 | 2.0 | 1.5 | 0.3 | 0.3 |
| Metal corrosion inhibitor | Benzotriazole | 0.1 | 0.1 | 0.1 | 0.1 | — | 0.1 |
| pH adjusting agent | Potassium hydroxide | Amount with which pH is adjusted to pH described below | | | | | |
| Water | Pure water | Remainder | | | | | |
| pH |  | 10.0 | 10.0 | 10.0 | 10.0 | 10.0 | 9.0 |
| Polishing rate (nm/min) | Cobalt | 8 | 4 | 68 | 56 | 22 | 24 |
|  | Insulating material | 11 | 6 | 62 | 53 | 28 | 27 |
| Polishing rate ratio (cobalt/insulating material) |  | 0.73 | 0.67 | 1.10 | 1.06 | 0.79 | 0.89 |

TABLE 4

|  |  | Comparative Example | | | |
| --- | --- | --- | --- | --- | --- |
|  |  | 1 | 2 | 3 | 4 |
| Abrasive grains | Silica particles | 3.0 | 4.0 | 4.0 | 4.0 |
| Sugar component | Sorbitol | — | — | 0.5 | — |
| Acid component | Citric acid | 0.3 | — | — | — |
|  | Malonic acid | — | 0.4 | 0.4 | 0.4 |
| Metal corrosion inhibitor | Benzotriazole | 0.1 | 0.1 | 0.1 | 0.1 |
| pH adjusting agent | Potassium hydroxide | Amount with which pH is adjusted to pH described below | | | |
| Water | Pure water | Remainder | | | |
| pH |  | 10.0 | 9.0 | 8.0 | 8.0 |
| Polishing rate (nm/min) | Cobalt | 20 | 27 | 26 | 25 |
|  | Insulating material | 35 | 50 | 48 | 47 |
| Polishing rate ratio (cobalt/insulating material) |  | 0.57 | 0.54 | 0.54 | 0.53 |

REFERENCE SIGNS LIST 10a, 10b, 10c: base substrate, 11: substrate, 13: insulating member, 13a: concave portion, 13b: convex portion, 15: liner portion, 17: conductive member, 19: embedded portion.

The invention claimed is:

1. A polishing method of polishing a surface to be polished containing cobalt by using a polishing liquid, the polishing liquid comprising:
abrasive grains; at least one sugar component selected from the group consisting of a sugar alcohol, an oligosaccharide, and a polysaccharide, the polysaccharide including at least one selected from the group consisting of a cellulose derivative in which at least a part of the hydroxyl groups of cellulose is etherified, dextrin, maltodextrin, cyclodextrin, dextran, amylose, and amylopectin; an acid component; and water, wherein
the polishing liquid does not comprise an oxidant,
the polishing liquid does not comprise pullulan, and
a pH of the polishing liquid is more than 8.0.

2. The polishing method according to claim 1, wherein the abrasive grains contain silica.

3. The polishing method according to claim 1, wherein the at least one sugar component includes the sugar alcohol.

4. The polishing method according to claim 3, wherein the sugar alcohol includes sorbitol.

5. The polishing method according to claim 3, wherein a content of the at least one sugar component is 10% by mass or less and a content of the abrasive grains is 20% by mass or less on the basis of the total mass of the polishing liquid.

6. The polishing method according to claim 1, wherein the at least one sugar component includes the polysaccharide.

7. The polishing method according to claim 6, wherein the polysaccharide includes at least one selected from the group consisting of hydroxyalkyl cellulose, dextrin, and dextran.

8. The polishing method according to claim 1, wherein a content of the at least one sugar component is 0.01 to 20% by mass on the basis of the total mass of the polishing liquid.

9. The polishing method according to claim 1, wherein the acid component includes an organic acid.

10. The polishing method according to claim 1, wherein a content of the abrasive grains is 0.5% by mass or more on the basis of the total mass of the polishing liquid, and
a pH of the polishing liquid is more than 9.0.

11. The polishing method according to claim 1, wherein a content of the abrasive grains is 0.5% by mass or more on the basis of the total mass of the polishing liquid, and
the at least one sugar component includes the sugar alcohol.

12. The polishing method according to claim 1, wherein a content of the abrasive grains is 0.5% by mass or more on the basis of the total mass of the polishing liquid,
the at least one sugar component includes the polysaccharide, and
the polysaccharide includes at least one selected from the group consisting of hydroxypropyl cellulose, dextrin, and dextran.

13. The polishing method according to claim 1, wherein a content of the acid component is 0.005 to 1.5% by mass on the basis of the total mass of the polishing liquid, and
a pH of the polishing liquid is more than 9.0.

14. The polishing method according to claim 1, wherein a content of the acid component is 0.005 to 1.5% by mass on the basis of the total mass of the polishing liquid, and
the at least one sugar component includes the sugar alcohol.

15. The polishing method according to claim 1, wherein a content of the acid component is 0.005 to 1.5% by mass on the basis of the total mass of the polishing liquid,
the at least one sugar component includes the polysaccharide, and
the polysaccharide includes at least one selected from the group consisting of hydroxypropyl cellulose, dextrin, and dextran.

16. The polishing method according to claim 1, wherein the polishing liquid further comprises a metal corrosion inhibitor, and
a pH of the polishing liquid is more than 9.0.

17. The polishing method according to claim 1, wherein the polishing liquid further comprises a metal corrosion inhibitor, and
the at least one sugar component includes the sugar alcohol.

18. The polishing method according to claim 1, wherein the polishing liquid further comprises a metal corrosion inhibitor, the at least one sugar component includes the polysaccharide, and the polysaccharide includes at least one selected from the group consisting of hydroxypropyl cellulose, dextrin, and dextran.

19. The polishing method according to claim 1, wherein
the at least one sugar component includes the sugar alcohol, and
a pH of the polishing liquid is more than 9.0.

20. The polishing method according to claim 1, wherein the acid component includes at least one selected from the group consisting of an organic acid, an organic acid ester, an organic acid salt, an inorganic acid, and an inorganic acid salt.

21. The polishing method according to claim 1, wherein the cellulose derivative includes at least one selected from the group consisting of alkyl cellulose, hydroxyalkyl cellulose, and carboxyalkyl cellulose.

* * * * *